US012641885B2

(12) United States Patent
Long

(10) Patent No.: US 12,641,885 B2
(45) Date of Patent: May 26, 2026

(54) ARRAY SUBSTRATE AND DISPLAY PANEL

(71) Applicant: WUHAN CHINA STAR OPTOELECTRONICS TECHNOLOGY CO., LTD., Wuhan (CN)

(72) Inventor: Shiyu Long, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 384 days.

(21) Appl. No.: 18/458,264

(22) Filed: Aug. 30, 2023

(65) Prior Publication Data

US 2024/0113137 A1 Apr. 4, 2024

(30) Foreign Application Priority Data

Sep. 30, 2022 (CN) .......................... 202222636126.0

(51) Int. Cl.
*H10D 86/60* (2025.01)
*H10D 30/67* (2025.01)
*H10D 86/40* (2025.01)

(52) U.S. Cl.
CPC .......... *H10D 86/60* (2025.01); *H10D 86/451* (2025.01)

(58) Field of Classification Search
CPC ... H10D 86/60; H10D 86/451; H10D 86/6723
See application file for complete search history.

(56) References Cited

U.S. PATENT DOCUMENTS

2016/0329390 A1* 11/2016 Ono ................... H10D 30/6755

FOREIGN PATENT DOCUMENTS

WO WO-2021159243 A1 * 8/2021 ......... H10K 59/8791
WO WO-2022165964 A1 * 8/2022 ......... H10D 30/0321

* cited by examiner

*Primary Examiner* — Monica D Harrison
*Assistant Examiner* — Jacob T Nelson
(74) *Attorney, Agent, or Firm* — PV IP PC; Peter Stecher; Wei Te Chung

(57) ABSTRACT

An array substrate includes a substrate, an active layer on the substrate, a first insulating layer on the active layer, a first anti-reflective coating layer on the first insulating layer, a second insulating layer on the first anti-reflective coating layer, a source on the second insulating layer, and a drain on the second insulating layer. The source includes a first electrode portion and a second electrode portion. The drain includes a third electrode portion and fourth electrode portion. An orthographic projection of the second electrode portion or the fourth electrode portion on the substrate overlaps with an orthographic projection of the first anti-reflective coating layer on the substrate.

20 Claims, 2 Drawing Sheets

ARRAY SUBSTRATE AND DISPLAY PANEL

CROSS REFERENCE TO RELATED APPLICATION

This application claims priority to Chinese Application No. 202222636126.0, filed on Sep. 30, 2022. The entire disclosure of the above application is incorporated herein by reference.

FIELD OF THE INVENTION

The present disclosure relates to the field of display technology, more specifically to an array substrate and a display panel.

BACKGROUND

With the development of 5G communication technology, virtual reality (VR) technology is in a period of rapid development due to improvement of content and hardware. VR technology has high requirements for the pixel density of the display panel (specifically requiring the pixel density of the display panel to be greater than 1000), but the existing display panel with a pixel density greater than 1000 has serious signal crosstalk. The photogenerated leakage current generated by the thin film transistors (TFTs) of the display panel will cause signal crosstalk, thereby affecting the display quality of the display panel. In view of this, it is necessary to solve the signal crosstalk problem of display panels with high pixel density.

SUMMARY

The present disclosure provides an array substrate and a display panel to improve the signal crosstalk problem of a high pixel density display panel.

According to a first aspect of the present disclosure, an array substrate includes a substrate, an active layer disposed on the substrate, a first insulating layer disposed on a side of the active layer away from the substrate, a first anti-reflective coating layer disposed on a side of the first insulating layer away from the substrate, a second insulating layer disposed on a side of the first anti-reflective coating layer away from the substrate, a source disposed on a side of the second insulating layer away from the substrate, and a drain disposed on the side of the second insulating layer away from the substrate. The source includes a first electrode portion connected to the active layer by a first hole through the first insulating layer and the second insulating layer, and a second electrode portion connected to the first electrode portion. The drain includes a third electrode portion and fourth electrode portion. The third electrode portion is connected to the active layer through a second hole through the first insulating layer and the second insulating layer. The fourth electrode portion is connected to the third electrode portion. An orthographic projection of the second electrode portion or the fourth electrode portion on the substrate overlaps with an orthographic projection of the first anti-reflective coating layer on the substrate.

Optionally, the active layer includes a first connecting portion, a conductive channel, and a second connecting portion. The first connecting portion is connected to the first electrode portion through the third hole through the first insulating layer and the second insulating layer. The second connecting portion is connected to the third electrode through the fourth hole through the first insulating layer and the second insulating layer. An orthographic projection of the conductive channel on the substrate overlaps with an orthographic projection of the first anti-reflective coating layer on the substrate.

Optionally, the array substrate further includes a shading electrode disposed on the substrate, and a buffer layer, disposed on a side of the shading electrode away from the substrate. The active layer is disposed on a side of the buffer layer away from the substrate, and an orthographic projection of the shading electrode on the substrate overlaps with on the orthographic projection of the conductive channel on the substrate.

Optionally, the array substrate further includes a second anti-reflective coating layer, a gate, and an interlayer dielectric layer. The second anti-reflective coating layer is disposed on a side of the first insulating layer away from the substrate. The gate is disposed on a side of the second anti-reflective coating layer away from the substrate. The interlayer dielectric layer is disposed on a side of the gate away from the substrate. The first anti-reflective coating layer is disposed on a side of the interlayer dielectric layer away from the substrate. An orthographic projection of the second anti-reflective coating layer on the substrate overlaps an orthographic projection of the gate on the substrate, and an orthographic projection of the active layer on the substrate overlaps an orthographic projection of the shading electrode on the substrate.

Optionally, the second anti-reflective coating layer is a metal oxide layer.

Optionally, the array substrate further includes a third anti-reflective coating layer which is disposed on a side of the shading electrode away from the substrate and covered by the buffer layer. An orthographic projection of the third anti-reflective coating layer on the substrate overlaps an orthographic projection of the active layer on the substrate, and an orthographic projection of the shading electrode on the substrate overlaps the orthographic projection of the active layer on the substrate.

Optionally, the array substrate further includes a first metal layer. The first metal layer is disposed on the second insulating layer. The first metal layer includes the source and the drain.

Optionally, the array substrate further includes a third insulating layer which is disposed on the side of the source away from the substrate. The drain is disposed on a side of the third insulating layer away from the substrate.

Optionally, the first anti-reflective coating layer is a metal oxide layer.

According to a second aspect of the present disclosure, a display panel includes an array substrate. The array substrate includes a substrate, an active layer disposed on the substrate, a first insulating layer disposed on a side of the active layer away from the substrate, a first anti-reflective coating layer disposed on a side of the first insulating layer away from the substrate, a second insulating layer disposed on a side of the first anti-reflective coating layer away from the substrate, a source disposed on a side of the second insulating layer away from the substrate, and a drain disposed on the side of the second insulating layer away from the substrate. The source includes a first electrode portion connected to the active layer by a first hole through the first insulating layer and the second insulating layer, and a second electrode portion connected to the first electrode portion. The drain includes a third electrode portion and fourth electrode portion. The third electrode portion is connected to the active layer through a second hole through the first insulating layer and the second insulating layer. The fourth electrode portion is connected to the third electrode portion. An orthographic projection of the second electrode portion or the fourth electrode portion on the substrate overlaps with an orthographic projection of the first anti-reflective coating layer on the substrate.

Optionally, the active layer includes a first connecting portion, a conductive channel, and a second connecting portion. The first connecting portion is connected to the first electrode portion through the third hole through the first insulating layer and the second insulating layer. The second connecting portion is connected to the third electrode through the fourth hole through the first insulating layer and the second insulating layer. An orthographic projection of the conductive channel on the substrate overlaps with an orthographic projection of the first anti-reflective coating layer on the substrate.

Optionally, the array substrate further includes a shading electrode disposed on the substrate, and a buffer layer, disposed on a side of the shading electrode away from the substrate. The active layer is disposed on a side of the buffer layer away from the substrate, and an orthographic projection of the shading electrode on the substrate overlaps with on the orthographic projection of the conductive channel on the substrate.

Optionally, the array substrate further includes a second anti-reflective coating layer, a gate, and an interlayer dielectric layer. The second anti-reflective coating layer is disposed on a side of the first insulating layer away from the substrate. The gate is disposed on a side of the second anti-reflective coating layer away from the substrate. The interlayer dielectric layer is disposed on a side of the gate away from the substrate. The first anti-reflective coating layer is disposed on a side of the interlayer dielectric layer away from the substrate. An orthographic projection of the second anti-reflective coating layer on the substrate overlaps an orthographic projection of the gate on the substrate, and an orthographic projection of the active layer on the substrate overlaps an orthographic projection of the shading electrode on the substrate.

Optionally, the second anti-reflective coating layer is a metal oxide layer.

Optionally, the array substrate further includes a third anti-reflective coating layer which is disposed on a side of the shading electrode away from the substrate and covered by the buffer layer. An orthographic projection of the third anti-reflective coating layer on the substrate overlaps an orthographic projection of the active layer on the substrate, and an orthographic projection of the shading electrode on the substrate overlaps the orthographic projection of the active layer on the substrate.

Optionally, the array substrate further includes a first metal layer. The first metal layer is disposed on the second insulating layer. The first metal layer includes the source and the drain.

Optionally, the array substrate further includes a third insulating layer which is disposed on the side of the source away from the substrate. The drain is disposed on a side of the third insulating layer away from the substrate.

Optionally, the first anti-reflective coating layer is a metal oxide layer.

According to a third aspect of the present disclosure, an array substrate includes a substrate, an active layer disposed on the substrate, a first insulating layer disposed on the active layer, a first anti-reflective coating layer disposed on the first insulating layer, a second insulating layer disposed on the first anti-reflective coating layer, a source disposed on the second insulating layer, a drain disposed on the second insulating layer. An orthographic projection of the source or the drain on the substrate overlaps with an orthographic projection of the first anti-reflective coating layer on the substrate.

Optionally, the active layer includes a first connecting portion, a conductive channel, and a second connecting portion. The first connecting portion is connected to the first electrode portion through the third hole through the first insulating layer and the second insulating layer. The second connecting portion is connected to the third electrode through the fourth hole through the first insulating layer and the second insulating layer. An orthographic projection of the conductive channel on the substrate overlaps with an orthographic projection of the first anti-reflective coating layer on the substrate.

The present disclosure provides an array substrate and a display panel. The array substrate includes a substrate, an active layer disposed on the substrate, a first insulating layer disposed on a side of the active layer away from the substrate, a first anti-reflective coating layer disposed on a side of the first insulating layer away from the substrate, a second insulating layer disposed on a side of the first anti-reflective coating layer away from the substrate, a source disposed on a side of the second insulating layer away from the substrate, and a drain disposed on the side of the second insulating layer away from the substrate. The source includes a first electrode portion connected to the active layer by a first hole through the first insulating layer and the second insulating layer, and a second electrode portion connected to the first electrode portion. The drain includes a third electrode portion and fourth electrode portion. The third electrode portion is connected to the active layer through a second hole through the first insulating layer and the second insulating layer. The fourth electrode portion is connected to the third electrode portion. An orthographic projection of the second electrode portion or the fourth electrode portion on the substrate overlaps with an orthographic projection of the first anti-reflective coating layer on the substrate. The present disclosure is provided with the first anti-reflective coating layer, and the orthographic projection of the first anti-reflective coating layer on the substrate overlaps with the orthographic projection of the second electrode portion or the fourth electrode portion on the substrate, so that the second electrode portion and the fourth electrode portion can be avoided from reflecting light to the active layer, thereby reducing the photoleakage current of the active layer, and improving the signal crosstalk problem of the display panel with high pixel density.

BRIEF DESCRIPTION OF THE DRAWINGS

In order to more clearly illustrate the technical solution in the embodiment of the present disclosure, the following will be a brief introduction to the drawings required in the description of the embodiment. Obviously, the drawings described below are only some embodiments of the present disclosure, for those skilled in the art, without the premise of creative labor, may also obtain other drawings according to these drawings.

DETAILED DESCRIPTION OF PREFERRED EMBODIMENTS

To help a person skilled in the art better understand the solutions of the present disclosure, the following clearly and completely describes the technical solutions in the embodiments of the present invention with reference to the accompanying drawings in the embodiments of the present invention. The described embodiments are a part rather than all of the embodiments of the present invention. All other embodiments obtained by a person of ordinary skill in the art based on the embodiments of the present invention without creative efforts shall fall within the protection scope of the present disclosure.

The term "first", "second" are for illustrative purposes only and are not to be construed as indicating or imposing a relative importance or implicitly indicating the number of technical features indicated. Thus, a feature that limited by "first", "second" may expressly or implicitly include at least one of the features.

In the description of the present disclosure, the meaning of "plural" is two or more, unless otherwise specifically defined.

Throughout the specification and claims, when it is described that an element is "connected" to another element, the element may be "directly connected" to the other element, or "electrically connected" to the other element through a third element.

Furthermore, the term "comprising" will be understood as meaning the inclusion of elements but not the exclusion of any other elements, unless explicitly described to the contrary.

The following disclosure provides many different embodiments or examples to implement different structures of the present disclosure. In order to simplify the disclosure of the present disclosure, the components and settings of specific examples are described below. They are for example purposes only and are not intended to limit this application. Further, the present disclosure may repeat reference numbers and/or reference letters in different examples, such duplication is for the purpose of simplification and clarity, and does not by itself indicate the relationship between the various embodiments and/or settings discussed. Further, the present disclosure provides various examples of specific processes and materials, but those of ordinary skill in the art may be aware of the application of other processes and/or the use of other materials. The following are described in detail, it should be noted that the order of description of the following embodiments is not used as a qualification for the preferred order of embodiments.

Figure 1:
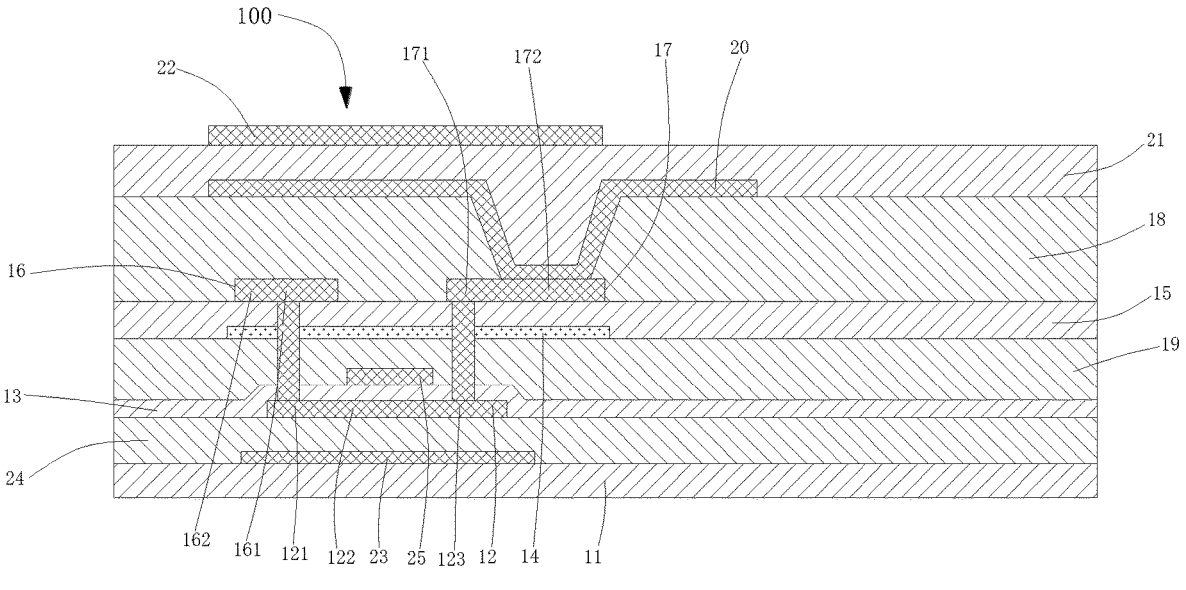
FIG. 1 is a schematic diagram of an array substrate according to a first embodiment of the present disclosure.

Referring to FIG. 1, FIG. 1 is a schematic diagram of the array substrate 100 according to a first embodiment of the present disclosure. The first embodiment of the present disclosure is directed to an array substrate 100. The array substrate 100 includes a substrate 11, an active layer 12, a first insulating layer 13, a first anti-reflective coating layer 14, a second insulating layer 15, a source 16, and a drain 17.

The active layer 12 is disposed on the substrate 11. The first insulating layer 13 is disposed on the side of the active layer 12 away from the substrate 11. The first anti-reflective coating layer 14 is disposed on the side of the first insulating layer 13 away from the substrate 11. The second insulating layer 15 is disposed on the side of the first anti-reflective coating layer 14 away from the substrate 11. The source 16 is disposed on the side of the second insulating layer 15 away from the substrate 11. The source 16 includes a first electrode portion 161 and a second electrode portion 162. The first electrode portion 161 is electrically connected to the active layer 12 by a first hole through the first insulating layer 13 and the second insulating layer 15. The drain 17 is disposed on the side of the second insulating layer 15 away from the substrate 11. The drain 17 includes a third electrode portion 171 and a fourth electrode portion 172. The third electrode portion 171 is electrically connected to the active layer 12 by a second hole through the first insulating layer 13 and the second insulating layer 15.

An orthographic projection of the source 16 or the drain 17 on the substrate 11 overlaps with an orthographic projection of the first anti-reflective coating layer 14 on the substrate 11. Optionally, the orthographic projection of at least one of the second electrode portion 162 and the fourth electrode portion 172 on the substrate 11 overlaps with the orthographic projection of the first anti-reflective coating layer 14 on the substrate 11.

Anti-reflective coating layer is used to reduce reflected light to improve light transmission. Further, in the present embodiment, the orthographic projections of the second electrode portion 162 and the fourth electrode portion 172 on the substrate 11 overlaps with the orthographic projection of the first anti-reflective coating layer 14 on the substrate 11.

Since the photoleakage current generated by the TFT device of the existing display panel will cause signal crosstalk, it is known that the light received by the active layer 12 of the TFT device of the display panel is mainly reflected from the metal layer in the display panel. Therefore, in order to solve the above technical problems, because the orthographic projection of the first anti-reflective coating layer 14 on the substrate 11 overlaps with the orthographic projection of the second electrode portion 162 or the fourth electrode portion 172 on the substrate 11, the second electrode portion 162 and the fourth electrode portion 172 are used to preventing light from reflecting to the active layer 12, thereby reducing the photoleakage current of the active layer 12. This improves signal crosstalk in display panels with high pixel density.

In some embodiments, the array substrate 100 further includes a gate 25 and an interlayer dielectric layer 19.

The gate 25 is disposed on the side of the first insulating layer 13 away from the substrate 11. The interlayer dielectric layer 19 is disposed on the side of the gate 25 away from the substrate 11. The first anti-reflective coating layer 14 is disposed on the side of the interlayer dielectric layer 19 away from the substrate 11.

In some embodiments, the array substrate 100 further includes a first metal layer. The first metal layer is disposed on the side of the second insulating layer 15 away from the substrate 11. The first metal layer comprises the source 16 and the drain 17.

In the present embodiment, the source 16 and the drain 17 are disposed on the same layer of metal to reduce the thickness of the display panel.

Further, in some embodiments, the array substrate 100 further includes a passivation layer 18, a second metal layer, a fourth insulating layer 21, and a third metal layer.

The passivation layer 18 is disposed on the side of the first metal layer away from the substrate 11. The second metal layer is disposed on the side of the passivation layer 18 away from the substrate 11. The second metal layer comprises a pixel electrode 20 electrically connected to the drain 17. The fourth insulating layer 21 is disposed on the side of the second metal layer away from the substrate 11. The fourth insulating layer 21 is an inorganic insulating layer. The third metal layer is disposed on the side of the fourth insulating layer 21 away from the substrate 11. The third metal layer comprises a common electrode 22.

Further, in some embodiments, the active layer 12 comprises a first connecting portion 121, a conductive channel 122 and a second connecting portion 123 connected. The first electrode portion 161 is electrically connected to the first connecting portion 121 by a third hole through the first insulating layer 13 and the second insulating layer 15. The third electrode portion 171 is connected to the second connecting portion 123 through a fourth hole through the first insulating layer 13 and the second insulating layer 15.

An orthographic projection of the conductive channel 122 on the substrate 11 overlaps with an orthographic projection of the first anti-reflective coating layer 14 on the substrate 11.

Since there are other metal electrodes in the display panel, such as pixel electrodes and common electrodes, these metal electrodes are also located above the active layer, so light is also reflected to the active layer. Because the orthographic projection of the conductive channel 122 on the substrate 11 overlaps the orthographic projection of the first anti-reflective coating layer 14 on the substrate 11, the present disclosure can reduce the light reflected to the active layer 12 by other metal layers in the display panel except the second electrode portion 162 and the fourth electrode portion 172. The photoleakage current of the active layer 12 may be further reduced.

Further, in some embodiments, the array substrate 100 further comprises a shading electrode 23 and a buffer layer 24. The shading electrode 23 is disposed on the substrate 11. The buffer layer 24 is disposed on the side of the shading electrode 23 away from the substrate 11. The active layer 12 is disposed on the side of the buffer layer 24 away from the substrate 11. An orthographic projection of the shading electrode 23 on the substrate 11 overlaps an orthographic projection of the conductive channel 122 on the substrate 11.

Because the orthographic projection of the shading electrode 23 on the substrate 11 overlaps the orthographic projection of the conductive channel 122 on the substrate 11, the light emitted from the backlight module is not incident to the conductive channel 122, so that the photoleakage current of the active layer 12 can be further reduced.

Further, in some embodiments, the material of the first anti-reflective coating layer 14 comprises a metal oxide. Optionally, the material of the first anti-reflective coating 14 is molybdenum oxide.

Accordingly, another embodiment of the present disclosure also provides a manufacturing method for an array substrate 100. First, the shading electrode 23 is formed on the substrate 11. The buffer layer 24 is formed on the shading electrode 23. The active layer 12 is formed on the buffer layer 24. The orthographic projection of the active layer 12 on the substrate 11 overlaps an orthographic projection the shading electrode 23 on the substrate 11. The first insulating layer 13 is formed on the active layer 12. The gate 25 is formed on the first insulating layer 13. The interlayer dielectric layer 19 is formed on the gate 25. The first anti-reflective coating layer 14 is formed on the interlayer dielectric layer 19. The second insulating layer 15 is formed on the first anti-reflective coating layer 14.

The first metal layer is formed on the second insulating layer 15. The first metal layer comprises the source 16 and the drain 17. The source 16 comprises a first electrode portion 161 and a second electrode portion 162. The first electrode portion 161 is connected to the active layer 12 through a third hole through the first insulating layer 13 and the second insulating layer 15. The drain 17 includes a third electrode portion 171 and a fourth electrode portion 172. The third electrode portion 171 is connected to the active layer 12 through a fourth hole through the first insulating layer 13 and the second insulating layer 15. An orthographic projection of the second electrode portion 162 or the fourth electrode portion 172 on the substrate 11 overlaps with an orthographic projection of the first anti-reflective coating layer 14 on the substrate 11.

The manufacturing method further includes forming the passivation layer 18 on the first metal layer. Then a second metal layer is formed on the passivation layer 18. The second metal layer includes a pixel electrode 20 that is connected to the drain 17.

The manufacturing method further includes forming the fourth insulating layer 21 on the second metal layer. Then the third metal layer is formed on the fourth insulating layer 21. The third metal layer comprises a common electrode 22.

Accordingly, the present disclosure also provides a display panel which comprises the array substrate 100 as described above.

The principle of solving the problem of the display panel is similar to the aforementioned array substrate 100, so the implementation and beneficial effect of the display panel may refer to the description of the aforementioned array substrate 100. The duplication will not be repeated herein.

Figure 2:
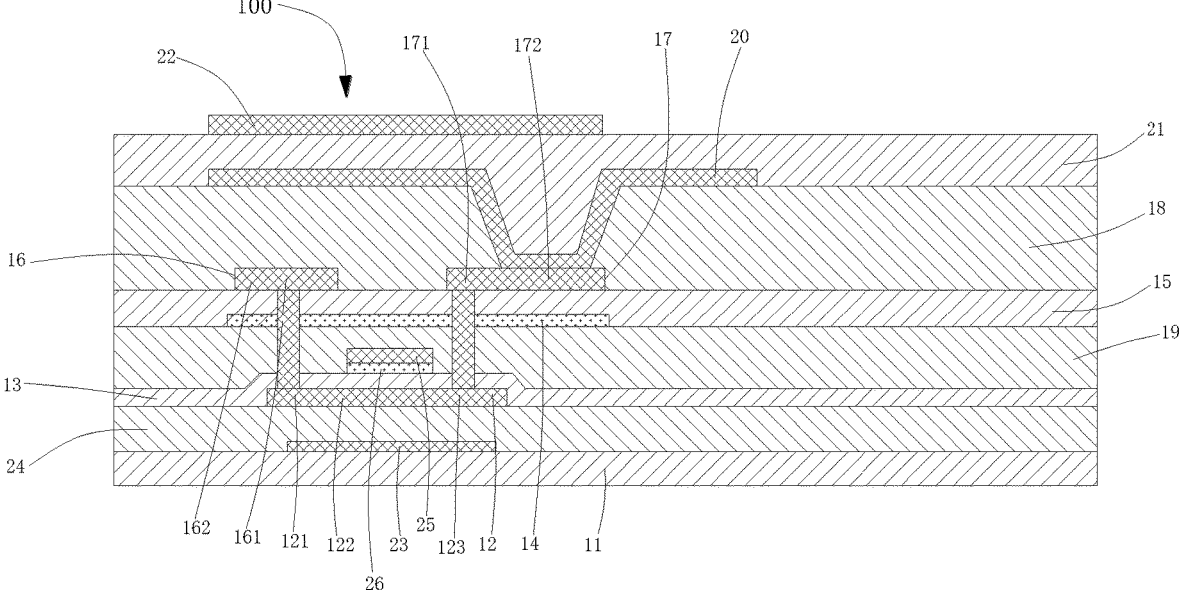
FIG. 2 is a schematic diagram of an array substrate according to a second embodiment of the present disclosure.

Referring to FIG. 2, FIG. 2 is a schematic diagram of an array substrate according to a second embodiment of the present disclosure. Differing from the array substrate 100 illustrated in FIG. 1, in the second embodiment of the present disclosure, an orthographic projection of the active layer 12 on the substrate 11 overlaps an orthographic projection of the shading electrode 23 on the substrate 11.

The array substrate 100 further includes a second anti-reflective coating layer 26, a gate 25, and an interlayer dielectric layer 19.

The second anti-reflective coating layer 26 is disposed on the side of the first insulating layer 13 away from the substrate 11. The is disposed on the side of the second anti-reflective coating layer 26 away from the substrate 11. An orthographic projection of the second anti-reflective coating layer 26 on the substrate 11 overlaps an orthographic projection of the gate 25 on the substrate 11. The interlayer dielectric layer 19 is disposed on the side of the gate 25 away from the substrate 11, and the first anti-reflective coating layer 14 is disposed on the side of the interlayer dielectric layer 19 away from the substrate 11.

Since the orthographic projection of the active layer 12 on the substrate 11 overlaps an orthographic projection of the shading electrode 23 on the substrate 11, there is a situation where the light emitted from the backlight module is incident to the gate 25, and the light is then reflected by the gate 25 to the active layer. In this embodiment, the gate 25 on the second anti-reflective coating layer 26 may be prevented from reflecting the light to the active layer 12, thereby further reducing the photoleakage current of the active layer 12.

Further, in some embodiments, the material of the second anti-reflective coating layer 26 comprises a metal oxide. Specifically, the material of the second anti-reflective coating layer 26 is molybdenum oxide.

Figure 3:
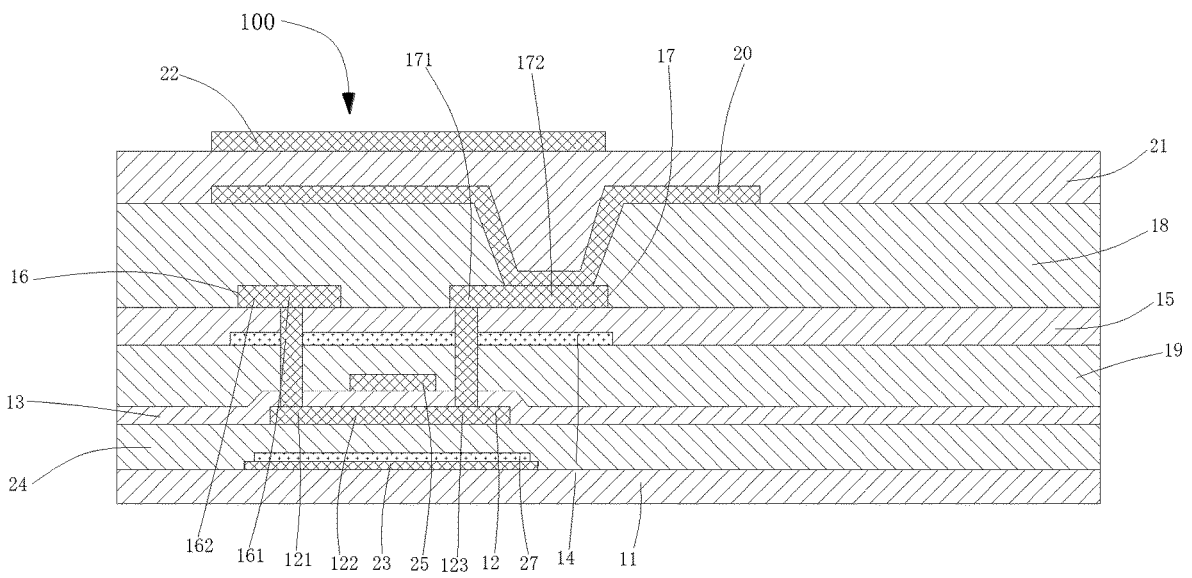
FIG. 3 is a schematic diagram of an array substrate according to a third embodiment of the present disclosure.

Referring to FIG. 3, FIG. 3 is a schematic diagram of an array substrate according to a third embodiment of the present disclosure. Differing from the array substrate 100 illustrated in FIG. 1, in the third embodiment of the present disclosure, an orthographic projection of the shading electrode 23 on the substrate 11 overlaps the orthographic projection of the active layer 12 on the substrate 11.

The array substrate 100 further includes third anti-reflective coating layer 27 and a buffer layer 24. The third anti-reflective coating layer 27 is disposed on the side of the shading electrode 23 away from the substrate 11. The buffer layer 24 is disposed on the side of the third anti-reflective coating layer 27 away from the substrate 11. An orthographic projection of the third anti-reflective coating layer 27 on the substrate 11 overlaps an orthographic projection of the active layer 12 on the substrate 11. The buffer layer 24 is provided on the side of the third anti-reflective coating layer 27 away from the substrate 11.

Since an orthographic projection of the shading electrode 23 on the substrate 11 overlaps an orthographic projection of the active layer 12 on the substrate 11, the shading electrode 23 will reflect light to the active layer 12. The present disclosure by providing the shading electrode 23 with a third anti-reflective coating layer 27 can avoid the shading electrode 23 to reflect the light to the active layer 12, thereby further reducing the photoleakage current of the active layer 12.

Further, in some embodiments, the material of the third anti-reflective coating layer 27 comprises a metal oxide. Specifically, the material of the third anti-reflective coating layer 27 is molybdenum oxide.

Figure 4:
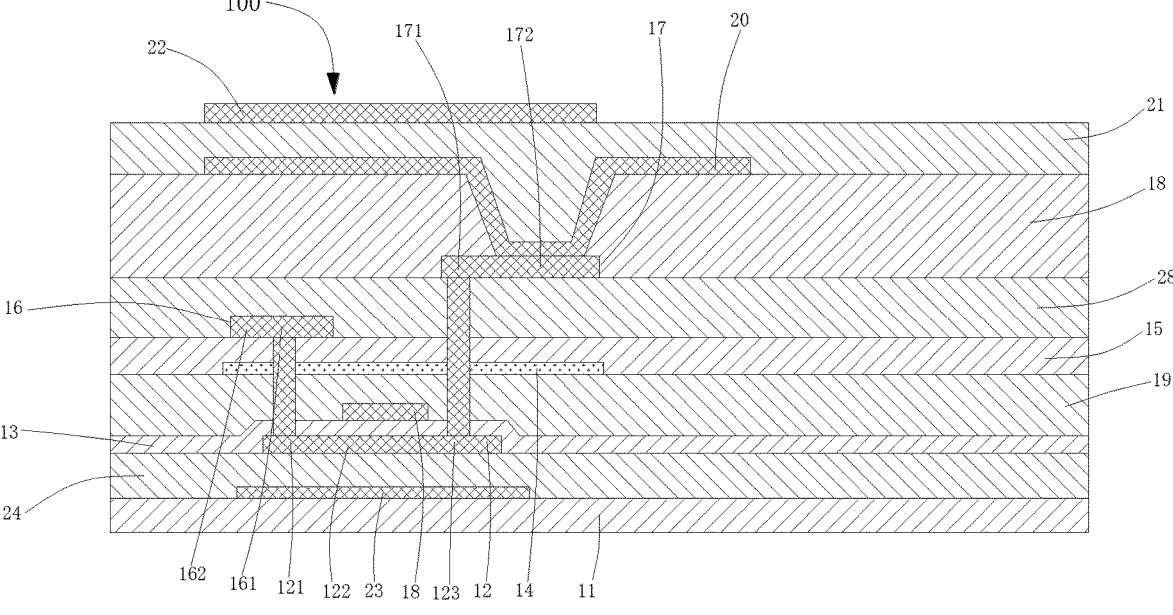
FIG. 4 is a schematic diagram of an array substrate according to a fourth embodiment of the present disclosure.

Referring to FIG. 4, FIG. 4 is a schematic diagram of an array substrate according to a fourth embodiment of the present disclosure. Differing from the array substrate 100 illustrated in FIG. 1, the array substrate 100 further includes a third insulating layer 28. The third insulating layer 28 is disposed on the side of the source 16 away from the substrate 11. The drain 17 is disposed on the side of the third insulating layer 28 away from the substrate 11.

That is, in the present embodiment, the source 16 and the drain 17 are set in different layers, which is conducive to reducing the crosstalk between the source 16 and the drain 17.

The above is a display device provided by an embodiment of the present disclosure is described in detail, and a specific example is applied herein to explain the principle and embodiment of the present disclosure, and the description of the above embodiment is only used to help understand the method of the present disclosure and its core ideas. At the same time, for those skilled in the art, according to the idea of the present disclosure, there will be changes in the specific embodiment and the scope of application, in summary, the content of this specification should not be understood as a restriction on the present disclosure.

What is claimed is:

1. An array substrate, comprising:
a substrate;
an active layer, disposed on the substrate;
a first insulating layer, disposed on a side of the active layer away from the substrate;
a gate, disposed on a side of the first insulating layer away from the substrate;
an interlayer dielectric layer, disposed on a side of the gate away from the substrate;
a first anti-reflective coating layer, disposed on a side of the interlayer dielectric layer away from the substrate;
a second insulating layer, disposed on a side of the first anti-reflective coating layer away from the substrate;
a source, disposed on a side of the second insulating layer away from the substrate and comprising:

a first electrode portion connected to the active layer by a first hole through the first insulating layer and the second insulating layer; and
a second electrode portion connected to the first electrode portion;
a drain, disposed on the side of the second insulating layer away from the substrate and comprising:
a third electrode portion connected to the active layer through a second hole through the first insulating layer and the second insulating layer; and
a fourth electrode portion, connected to the third electrode portion;
wherein the first anti-reflective coating layer is separated from the first electrode portion and the third electrode portion by the second insulating layer, an orthographic projection of the second electrode portion or the fourth electrode portion on the substrate overlaps with an orthographic projection of the first anti-reflective coating layer on the substrate, and the orthographic projection of the first anti-reflective coating layer on the substrate covers an orthographic projection of a conductive channel of the active layer on the substrate.

2. The array substrate according to claim 1, wherein the active layer comprises:
a first connecting portion, connected to the first electrode portion through the first hole through the first insulating layer and the second insulating layer; and
a second connecting portion, connected to the third electrode portion through the second hole through the first insulating layer and the second insulating layer;
wherein an orthographic projection of the conductive channel on the substrate overlaps with an orthographic projection of the first anti-reflective coating layer on the substrate.

3. The array substrate according to claim 2, further comprising:
a shading electrode, disposed on the substrate; and
a buffer layer, disposed on a side of the shading electrode away from the substrate,
wherein the active layer is disposed on a side of the buffer layer away from the substrate, and an orthographic projection of the shading electrode on the substrate overlaps with the orthographic projection of the conductive channel on the substrate.

4. The array substrate according to claim 3, further comprising:
a second anti-reflective coating layer, disposed on a side of the first insulating layer away from the substrate;
wherein an orthographic projection of the second anti-reflective coating layer on the substrate overlaps an orthographic projection of the gate on the substrate, and an orthographic projection of the active layer on the substrate overlaps an orthographic projection of the shading electrode on the substrate.

5. The array substrate according to claim 3, further comprising:
a second anti-reflective coating layer, disposed on a side of the shading electrode away from the substrate and covered by the buffer layer,
wherein an orthographic projection of the second anti-reflective coating layer on the substrate overlaps an orthographic projection of the active layer on the substrate, and an orthographic projection of the shading electrode on the substrate overlaps the orthographic projection of the active layer on the substrate.

6. The array substrate according to claim 4, wherein the second anti-reflective coating layer is a metal oxide layer.

7. The array substrate according to claim 1, further comprising:

a first metal layer, disposed on the second insulating layer and comprising the source and the drain.

8. The array substrate according to claim 1, further comprising:

a third insulating layer, disposed on the side of the source away from the substrate, wherein the drain is disposed on a side of the third insulating layer away from the substrate.

9. The array substrate according to claim 1, wherein the first anti-reflective coating layer is a metal oxide layer.

10. The array substrate according to claim 1, wherein the orthographic projection of the first anti-reflective coating layer on the substrate covers an orthographic projection of a part of the source excluding a part located in the first hole on the substrate, covers an orthographic projection of a part of the drain excluding a part located in the second hole on the substrate, and covers the orthographic projection of the conductive channel of the active layer on the substrate.

11. The array substrate according to claim 1, wherein a surface of the first anti-reflective coating layer away from the substrate is not in contact with a surface of the first electrode portion close to the substrate, and the surface of the first anti-reflective coating layer away from the substrate is not in contact with a surface of the third electrode portion close to the substrate.

12. A display panel comprising an array substrate, the array substrate comprising:

a substrate;

an active layer, disposed on the substrate;

a first insulating layer, disposed on a side of the active layer away from the substrate;

a gate, disposed on a side of the first insulating layer away from the substrate;

an interlayer dielectric layer, disposed on a side of the gate away from the substrate;

a first anti-reflective coating layer, disposed on a side of the interlayer dielectric layer away from the substrate;

a second insulating layer, disposed on a side of the first anti-reflective coating layer away from the substrate;

a source, disposed on a side of the second insulating layer away from the substrate and comprising:

a first electrode portion connected to the active layer by a first hole through the first insulating layer and the second insulating layer; and a second electrode portion connected to the first electrode portion;

a drain, disposed on the side of the second insulating layer away from the substrate and comprising:

a third electrode portion connected to the active layer through a second hole through the first insulating layer and the second insulating layer; and a fourth electrode portion, connected to the third electrode portion;

wherein the first anti-reflective coating layer is separated from the first electrode portion and the third electrode portion by the second insulating layer, an orthographic projection of the second electrode portion or the fourth electrode portion on the substrate overlaps with an orthographic projection of the first anti-reflective coating layer on the substrate, and the orthographic projection of the first anti-reflective coating layer on the substrate covers an orthographic projection of a conductive channel of the active layer on the substrate.

13. The display panel according to claim 12, wherein the active layer comprises:

a first connecting portion, connected to the first electrode portion through the first hole through the first insulating layer and the second insulating layer; and a second connecting portion, connected to the third electrode portion through the second hole through the first insulating layer and the second insulating layer;

wherein an orthographic projection of the conductive channel on the substrate overlaps with an orthographic projection of the first anti-reflective coating layer on the substrate.

14. The display panel according to claim 13, wherein the array substrate further comprises:

a shading electrode, disposed on the substrate; and a buffer layer, disposed on a side of the shading electrode away from the substrate, wherein the active layer is disposed on a side of the buffer layer away from the substrate, and an orthographic projection of the shading electrode on the substrate overlaps with the orthographic projection of the conductive channel on the substrate.

15. The display panel according to claim 14, wherein the array substrate further comprises:

a second anti-reflective coating layer, disposed on a side of the first insulating layer away from the substrate;

wherein an orthographic projection of the second anti-reflective coating layer on the substrate overlaps an orthographic projection of the gate on the substrate, and an orthographic projection of the active layer on the substrate overlaps an orthographic projection of the shading electrode on the substrate.

16. The display panel according to claim 14, wherein the array substrate further comprises:

a second anti-reflective coating layer, disposed on a side of the shading electrode away from the substrate and covered by the buffer layer, wherein an orthographic projection of the second anti-reflective coating layer on the substrate overlaps an orthographic projection of the active layer on the substrate, and an orthographic projection of the shading electrode on the substrate overlaps the orthographic projection of the active layer on the substrate.

17. The display panel according to claim 15, wherein the second anti-reflective coating layer is a metal oxide layer.

18. The display panel according to claim 12, wherein the first anti-reflective coating layer is a metal oxide layer.

19. An array substrate, comprising:

a substrate;

an active layer, disposed on the substrate;

a first insulating layer, disposed on the active layer;

a gate, disposed on a side of the first insulating layer away from the substrate;

an interlayer dielectric layer, disposed on a side of the gate away from the substrate;

a first anti-reflective coating layer, disposed on the interlayer dielectric layer away from the substrate;

a second insulating layer, disposed on the first anti-reflective coating layer;

a source, disposed on the second insulating layer and connected to the active layer by a first hole through the first insulating layer and the second insulating layer;

a drain, disposed on the second insulating layer connected to the active layer by a second hole through the first insulating layer and the second insulating layer;

wherein the first anti-reflective coating layer is separated from the first electrode portion and the third electrode portion by the second insulating layer, an orthographic projection of the source or the drain on the substrate overlaps with an orthographic projection of the first anti-reflective coating layer on the substrate, and the orthographic projection of the first anti-reflective coating layer on the substrate covers an orthographic projection of a conductive channel of the active layer on the substrate.

20. The array substrate according to claim 19, wherein the active layer comprises:

a first connecting portion, connected to the source through the first hole through the first insulating layer and the second insulating layer; and a second connecting portion, connected to the drain through the fourth-second hole through the first insulating layer and the second insulating layer;

wherein an orthographic projection of the conductive channel on the substrate overlaps with an orthographic projection of the first anti-reflective coating layer on the substrate.

* * * * *